US005521389A

United States Patent [19]

Kim

[11] Patent Number: 5,521,389

[45] Date of Patent: May 28, 1996

[54] SOLID STATE CESIUM ION GUN

[76] Inventor: Seong I. Kim, 438 Andre Ave., North Vale, N.J. 07647

[21] Appl. No.: 408,701

[22] Filed: Mar. 21, 1995

[51] Int. Cl.$^6$ .................................................. H01J 37/08

[52] U.S. Cl. .................. 250/423 R; 313/230; 313/359.1

[58] Field of Search ..................... 250/423 R; 313/359.1, 313/230

[56] References Cited

U.S. PATENT DOCUMENTS

| | | | |
|---|---|---|---|
| 2,261,569 | 11/1941 | Schultz | 250/84 |
| 2,816,243 | 12/1957 | Herb et al. | 313/63 |
| 2,901,628 | 8/1959 | Lamb | 250/49.5 |
| 4,783,595 | 11/1988 | Seidl | 250/423 R |
| 4,994,711 | 2/1991 | Matossian | 250/423 R |

FOREIGN PATENT DOCUMENTS

| | | |
|---|---|---|
| 57-109244 | 7/1982 | Japan . |
| 1-132033 | 5/1989 | Japan . |
| 1-151129 | 6/1989 | Japan . |
| 3-129652 | 6/1991 | Japan . |
| 4-2031 | 1/1992 | Japan . |
| 543306 | 8/1978 | U.S.S.R. . |

OTHER PUBLICATIONS

Cesium ion Transport across a solid electrolyte–porous tungsten interface, S. I. Kim and M. Seidl, J. Vac. Sci Technol. A 7 (3) May/Jun. 1989, pp. 1806–1809.

Theory Of Metal–Solid Electrolyte Interface, S. I. Kim, M. Seidl, Physics/Engineering Physics Department, Stevens Institute of Technology, Hoboken, N.J., Mal. Res. Symp. Proc. vol. 135, 1989 Materials Research Society, pp. 95–100.

Solid–state cesium ion gun for ion beam sputter deposition, S. I. Kim, Y. O. Ahn, and M. Seidel, Department of Physics, Stevens Institute of Technology, Hoboken, N.J. 07030, Rev. Sci. Instrum. 63 (12) Dec. 1992, 1992 American Institute of Physics, pp. 5671–5673.

Sputtering negative carbon ions from cesiated graphite surfaces, A. Pargellis and M. Seidl, J. Vac. Sci. Technol. A 1 (3) Jul.–Sep. 1983, 1983 American Vacuum Society, pp. 1388–1393.

A New Solid–State Cesium Ion Source, by S. I. Kim and M. Seidl, Physics/Engineering Stevens Institute of Technology, J. Appl. Phys. 67 (6), 15 Mar. 1990, pp. 2704–2710.

Aluminosilicate–composite type ion source of alkali ions by D. W. Hughes, R. K. Feeney and D. N. Hill Rev. Sci. Instrum 51(11), Nov. 1980 American Institute of Physics pp. 1471–1473.

Ion Propulsion Technology and Applications by G. R. Brewer, Gordon and Breach Science Publishers 102–107.

Lithium Ion Emitter for Low Energy Beam Experiments, by O. Heinz and R. T. Reaves Received Apr. 1, 1968, pp. 1229–1230.

A Sputter Pig Source (SPIGS) For Negative Ions by H. V. Smith, Jr. and H. T. Richards Nuclear Instruments and Methods 125 No. 4 1975 pp. 497–502.

A Hollow–Beam Prototype of the Universal Negative Ion Source For Tandem Accelerators J. E. Sherwood and R. D. Zwicker pp. 43–45, Nuclear Instruments and Methods 129 No. 1 (1975).

*Primary Examiner*—Jack I. Berman
*Attorney, Agent, or Firm*—Ohlandt, Greeley, Ruggiero & Perle

[57] ABSTRACT

A solid state cesium ion gun comprises an ion emission pellet, a pellet heating mechanism, a replaceable ion source unit, ion extraction electrodes, and a self-supporting feedthrough flange. The ion emission pellet is capable of emitting positive cesium ions. One end of the pellet is sputter coated with a thin film of porous tungsten (cathode) from which ions are emitted. The other end of the pellet (anode) is coated with platinum which enables application of a bias to the pellet to direct the cesium ions toward the emitting electrode. The area of the anode electrode determines the life of the ion source. The ion emission pellet is heated to 1000° C. and is not in contact with the beam forming electrode so as to minimize the heat losses. A thin tantalum or molybdenum tube is used to enclose the pellet and minimizes heat conduction losses. The ion gun includes a replaceable ion source unit and a mountable gun unit which mounts extraction electrodes. The ion source unit can be replaced when the pellet has exhausted all of its cesium.

8 Claims, 2 Drawing Sheets

SOLID STATE CESIUM ION GUN

FIELD OF THE INVENTION

This invention relates to ion beam sources and, more particularly, to a cesium positive ion beam gun that utilizes a solid state cesium ion source.

BACKGROUND OF THE INVENTION

Ion sources are used in implantation, sputter deposition, ion beam assisted deposition, ion spectroscopy, and direct ion beam deposition. In most conventional ion beam sources, ion beams are produced by extracting charged particles from a gas discharge (including plasma and arc-derived discharges).

One type of ion source is a contact or surface ionization source. A conventional contact ionization source for cesium ions is shown in G. R. Brewer, "Ion Propulsion: Technology and Applications", (Gordon and Breach, 1970), pp. 102–105. and includes a porous tungsten contact ionizer. Cesium is vaporized in a cesium reservoir and is transported to the porous contact ionizer through a manifold. The contact ionizer is kept at 900° C.–1200° C. Cesium ions are produced on the surface of the contact ionizer by surface ionization effects.

Examples of a thermionic emission solid state ion source are described by O. Heinz and R. T. Reaves in "Lithium Ion Emitter for Low Energy Beam Experiments," Rev. Sci. Instr., vol. 39, pp. 1229–1230 (August 1968) and by D. W. Hughes, R. K. Fenney and D. N. Hill in "Aluminosilicate-Composite Type Ion Source of Alkali Ions," Rev. Sci Instr., vol. 51, pp 1471–1472 (November 1980). Thermionic sources use aluminosilicate base alkali ion emitting compounds.

A very similar prior art system is described by M. Seidl in "Solid-State Source of Ions and Atoms", U.S. Pat. No. 4,783,595. The Seidl ion source combines the advantages of porous metal contact ionizers with those of aluminosilicate emitters. A porous refractory thin film is coated on the emitting surface of a solid electrolyte. Cesium is supplied to the emitting surface under the influence of a bias voltage applied across the electrolyte. Ion emission of cesium takes place on the surface of the porous tungsten thin film by surface ionization. Seong I. Kim and Milos Seidl describe the aforementioned solid state cesium ion source in "Cesium Ion Transport Across A Solid Electrolyte-Porous Tungsten Interface", J. Vac. Sci. Technol. A7(3), pp. 1806–1809 (May/June 1989) and in "A New Solid-State Cesium Ion Source", J. Appl. Phys., 67(6), pp. 2704–2710 (March 1990).

A solid state ion source has many benefits when compared with a gas ion source. A solid state ion source can be operated in $<10^{-10}$ Torr without the use of differential pumping or associated hardware necessary for operation of a gas ion source. The solid state ion source is compact and easy to operate.

SUMMARY OF THE INVENTION

A solid state cesium ion gun comprises an ion emission pellet, a pellet heating mechanism, a replaceable ion source unit, ion extraction electrodes, and a self-supporting feedthrough flange.

The ion emission pellet is capable of emitting positive cesium ions and has a chemical composition Of $Cs_2O.Al_2O_3.10SiO_2$. One end of the pellet is sputter coated with a thin film of porous tungsten (cathode) from which ions are emitted. The other end of the pellet (anode) is coated with platinum which enables application of a bias to the pellet to direct the cesium ions toward the emitting electrode. The area of the anode electrode determines the life of the ion source. The ion emission pellet is heated to 1000° C. and is not in contact with the beam forming electrode so as to minimize the heat losses. A tantalum or molybdenum tube is used to enclose the pellet and minimizes heat conduction losses.

The ion gun includes a replaceable ion source unit and a mountable gun unit which mounts extraction electrodes. The ion source unit can be replaced when the pellet has exhausted all of its cesium.

The extraction of ions occurs by applying a potential between a beam forming electrode and the extracting electrode. Both electrodes are gridless and provide maximum transmission of the ion beam as well as a capability to be operated at a high voltage.

The beam forming electrode is supported by shaped insulator assemblies which both block residual cesium deposits and greatly increase the conduction path length along the insulator assemblies.

The replaceable ion source unit is inserted onto the beam forming electrode. A bellows feedthrough provides a self-supporting action. When the ion gun is mounted in a high vacuum chamber, the pressure forces the ion source unit into engagement with the beam forming electrode.

DETAILED DESCRIPTION OF THE INVENTION

Figure 1:
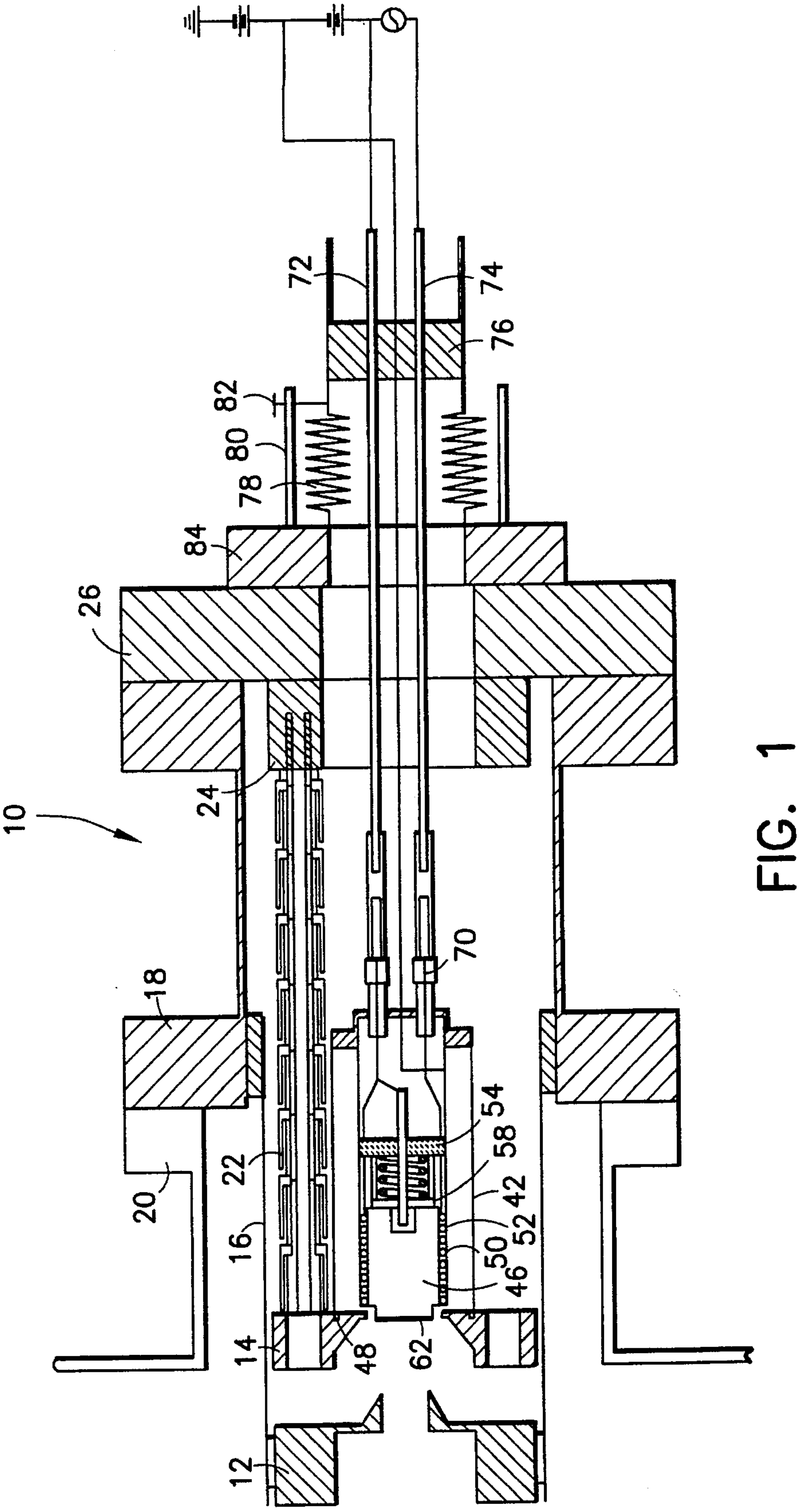
FIG. 1 is a cross-sectional view of an ion gun constructed in accordance with the invention.

Referring to FIG. 1, an ion gun 10 includes an extraction electrode 12 and a beam forming electrode 14 which, together, comprise a gridless electrode system for the production of a cesium ion beam. Extraction electrode 12 and beam forming electrode 14 comprise a Pierce-type electrode system which is known in the art and is designed through the use of a computer ion beam simulation code. Extraction electrode 12 is maintained at ground potential and is concentrically mounted within an outer metal tube 16. Tube 16 is, in turn, mounted to a con flat flange 18. Bolts (not shown) pass through flange 18 and into an extension portion 20 of a vacuum chamber wall, thereby fixing ion gun 10 in position so that electrodes 12 and 14 extend into the interior of the vacuum chamber.

A high voltage potential (3–5 kV) is applied to beam forming electrode 14. Beam forming electrode 14 is supported by a plurality of insulator assemblies 22 which are mounted in a circular bushing 24 that is, in turn, mounted on an end plate 26.

Figure 2:
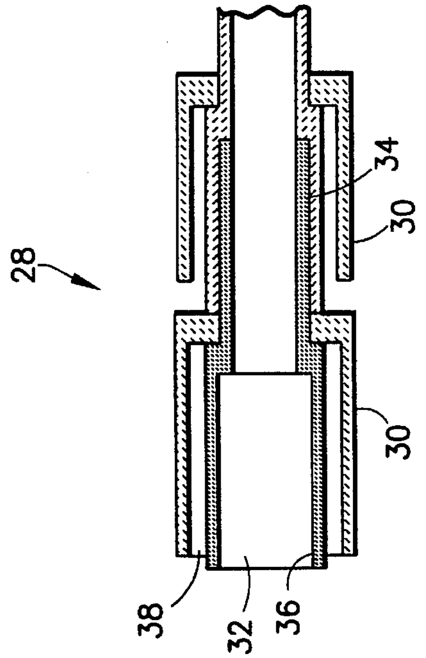
FIG. 2 is an enlarged partial cross-sectional view of a high voltage insulator employed with the invention.

Only one insulator assembly 22 is shown in FIG. 1 and comprises a plurality of nested, shaped, insulator inserts 28 in FIG. 2. Each insert comprises a cylindrical section 30 which is provided with an opening in its base. A dualdiameter insulator section 32 includes a smaller diameter section 34 which mates with the hole in the base of cylindrical section 30. A larger diameter section 36 is sized to receive a smaller diameter section of a further insulator insert 28.

When a plurality of insulator inserts 28 are assembled, the effective outer surface length of insulator assembly 22 is increased by a factor of 4 as compared to the end-to-end length thereof. The outer wall of cylindrical section 30 prevents direct deposition of residual cesium or other conducting elements within the enclosed annulus 38 between the insulator sections. Insulator assemblies 22 thereby provide a support function for beam forming electrode 14 and maintain it rigidly in place within cylinder 16.

Figure 3:
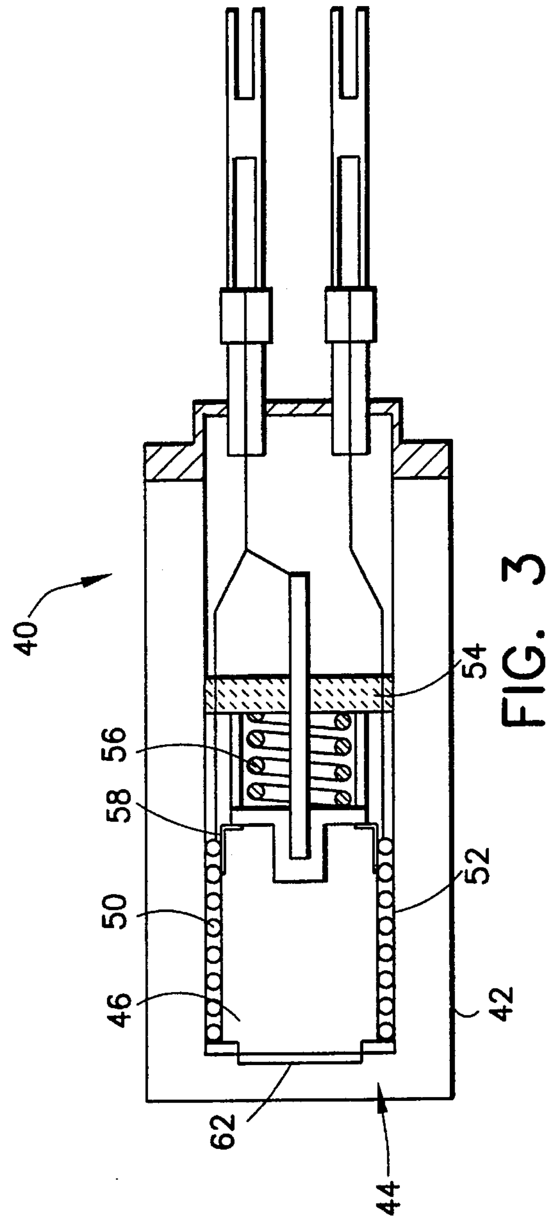
FIG. 3 is a cross-sectional view of the replaceable ion source employed with the invention.

FIG. 3 illustrates the replaceable cesium ion source unit 40 which is employed within ion gun 10. A metal tube 42 encloses the cesium ion source unit and is provided with an open end 44 that enables escape of cesium ions from ion pellet 46. The end of tube 42, at opening 44, mates with a circular trench 48 in extraction electrode 14. The length of the walls of tube 42 are such that cesium ion source 46 is prevented from touching extraction electrode 14 when the end of tube 42 is positioned in trench 48. This prevents extraction electrode 14 from acting as a heat sink for pellet 46.

A bifilar wound, alumina-coated filament 50 surrounds pellet 46 and is in turn, contained with a molybdenum or tantalum thin wall tube 52 which minimizes heat conduction from pellet 46. A ceramic plate 54 is positioned within tubing 52 and serves as a base against which a spring 56 is biased. Spring 56 maintain an electrical contact member 58 in contact with a metalized portion of pellet 46.

Figure 4:
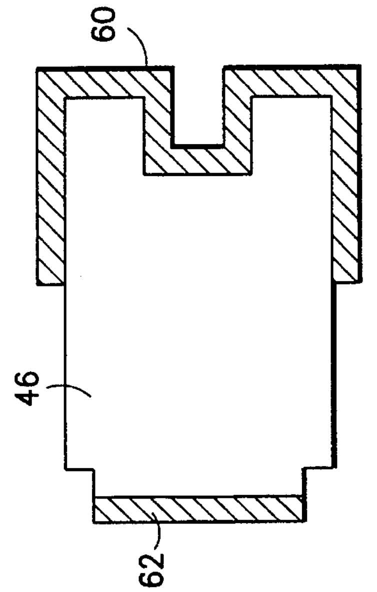
FIG. 4 is an enlarged partial cross-sectional view of the ion source pellet employed with the invention.

As shown in FIG. 4, pellet 46 is solid electrolyte which contains cesium and emits cesium ions when maintained at an elevated temperature (e.g. in the range of 900°–100° C.). An anode electrode 60 is plated on the rearmost portion of pellet 46 and provides electrical connection between pellet 46 and spring biased contact 58. Anode electrode 60 is not only as positioned on the rearmost portion of pellet 46 but also extends up along its sides so as to assure uniform current flow throughout the pellet. The lifetime of pellet 46 has been found to be dependent upon the area of anode electrode 60. Therefore, by extending the electrode up along the sides of pellet 46, the pellet lifetime is extended. Platinum paste is preferred for anode electrode 60.

The emitting surface of pellet 46 is coated with a porous tungsten electrode 62. When pellet 46 is brought to an elevated temperature, cesiums are transported to and through tungsten electrode 62. It is preferred that tungsten electrode 62 be heated to more than 1000° C. for efficient ion emission.

By maintaining the emitting surface of pellet 46 out of contact with extraction electrode 14, heat transfer losses are minimized. The microscopic surface roughness and porosity of pellet 46 can be increased by controlling the sintering conditions during its production.

Returning to FIG. 1, electrical connection to anode electrode 60 and tungsten electrode 62 are made via conductive feedthroughs 70 which, in turn, pluggably interconnect with rods 72 and 74. Rods 72 and 74 are rigidly mounted in a plate 76 which forms a sealing end for one end of a bellows 78. A guide cylinder 80 surrounds bellows 78 and includes a slot in which a follower 82 travels. Follower 82 limits the inward/outward movement of bellows 78. Guide cylinder 80 is rigidly mounted on a flange 84 which is, in turn, removably mounted on flange 26.

When ion gun 10 is positioned as shown in FIG. 1, and the vacuum chamber is pumped down, the resulting vacuum within the chamber draws plate 76 to the left, thereby compressing bellows 78 and causing rods 72 and 74 to push ion gun 40 into rigid engagement with extraction electrode 14. If it is desired to replace ion source 40, all that is required is for flange 84 to be dismounted from flange 26 and the entire ion source is then able to be withdrawn to the right. By unplugging ion source 40 from rods 72 and 74, a new ion source can be installed.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A cesium ion gun comprising:

a cesium ion gun housing;

a cesium source housing having an open end and positioned within said cesium ion gun housing;

an ion source pellet positioned within said cesium source housing;

means for applying a voltage across said ion source pellet;

heater means positioned adjacent said ion source pellet;

beam extraction electrode means in engagement with said open end of said cesium source housing, said cesium source housing enabling a positioning of said ion source pellet in juxtaposition to said beam extraction electrode means, but out of direct physical contact therewith; and flexible feedthrough means in said cesium ion gun housing and including supports coupled to said cesium source housing, said flexible feedthrough means held in compression by a vacuum within a vacuum chamber when said cesium gun housing is mounted in communication with said vacuum chamber, said compression forcing said cesium source housing against said beam extraction electrode means.

2. The cesium ion gun as recited in claim 1 wherein said beam extraction electrode means is concentrically positioned about a face of said ion source pellet, said cesium ion gun further comprising:

beam forming electrode means positioned concentrically with said beam extraction electrode means and supported by said cesium ion gun housing, said beam forming electrode means and beam extraction electrode means provided with grid-less apertures which allow ions emitted from said ion source pellet to pass and into said vacuum chamber.

3. The cesium ion gun as recited in claim 2, further comprising:

insulator means positioned between said beam extraction electrode means and said cesium gun housing for supporting said beam extraction electrode means within said cesium gun housing, said insulator means comprising plural nested insulator segments, a first insulator segment being in a form of a hollow cylinder with an opening in a base of said hollow cylinder, a second insulator segment being in a form of end-to-end connected first and second sub-cylinders, a first sub-cylinder having a larger diameter than said opening in said base of said first insulator segment, a second sub-cylinder having a diameter that enables said second sub-cylinder to pass through said opening, said first sub-cylinder including a hollow central portion that is adapted to receive a nesting second sub-cylinder from an adjoining insulator segment, plural ones of said first and second sub-cylinders, when nested together, causing said insulator means to exhibit an extended exterior surface length, portions of said exterior surface length being positioned between an inner surface of said hollow central portion of said first insulator segment and an exterior surface of a first sub-cylinder nested therein.

4. The Cesium ion gun as recited in claim 3 wherein, when said insulator means is assembled, an external surface of each said base of a first insulator segment is separated from an uppermost edge of a hollow cylinder portion of an adjoining first insulator segment so as to substantially occlude a space between an inner surface of said hollow cylinder portion and an outer surface of a first sub-cylinder positioned within said hollow cylinder portion.

5. The cesium ion gun as recited in claim 1 wherein said ion source pellet comprises an alumino-silicate based solid electrolyte including cesium species, said pellet including at least first and second electrodes, a first electrode comprising a cesium ion emitting porous tungsten thin film and a second electrode comprising a counter electrode.

6. The cesium ion gun as recited in claim 5 wherein said second electrode comprises a layer of metal intimately positioned both on a base portion of said pellet and extending to cover side portions of said pellet.

7. The cesium ion gun as recited in claim 6 wherein said heater means comprises a bi-filar wound tungsten filament positioned about said pellet, said filament being further enclosed by a tube for supporting said filament and pellet, said tube comprised of a high temperature material selected from the group consisting of molybdenum and tantalum.

8. The cesium ion gun as recited in claim 7 wherein said flexible feedthrough means comprises a bellows with one end rigidly mounted to removable flange means that are coupled to said cesium ion gun housing, whereby removal of said removable flange means from said cesium ion gun housing enables removal of said cesium source housing and ion source pellet as a unit from within said cesium ion gun housing.

* * * * *